United States Patent
Lee et al.

(10) Patent No.: US 10,083,840 B2
(45) Date of Patent: Sep. 25, 2018

(54) SYSTEM AND METHOD FOR REGENERATING PHOSPHORIC ACID SOLUTION, AND APPARATUS AND METHOD FOR TREATING SUBSTRATE

(71) Applicant: SEMES CO., LTD., Chungcheongnam-do (KR)

(72) Inventors: Seungho Lee, Chungcheongnam-do (KR); Minhee Cho, Daejeon (KR); Ki-Moon Kang, Chungcheongnam-do (KR); Tae-Keun Kim, Incheon (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 15/166,562

(22) Filed: May 27, 2016

(65) Prior Publication Data

US 2016/0351412 A1    Dec. 1, 2016

(51) Int. Cl.
| | | |
|---|---|---|
| *H01L 21/311* | (2006.01) | |
| *H01L 21/67* | (2006.01) | |
| *B01D 11/04* | (2006.01) | |
| *B01D 1/00* | (2006.01) | |
| *C09K 13/08* | (2006.01) | |

(52) U.S. Cl.
CPC ...... *H01L 21/31111* (2013.01); *B01D 1/0011* (2013.01); *B01D 1/0041* (2013.01); *B01D 1/0082* (2013.01); *B01D 11/0484* (2013.01); *B01D 11/0492* (2013.01); *C09K 13/08* (2013.01); *H01L 21/6708* (2013.01); *H01L 21/67017* (2013.01)

(58) Field of Classification Search
CPC ........... H01L 21/3111; H01L 21/67017; H01L 21/6708; B01D 1/0011; B01D 1/0041; B01D 1/0082; B01D 11/0484; B01D 11/0492; C09K 13/08

See application file for complete search history.

(56) References Cited

U.S. PATENT DOCUMENTS

| | | | |
|---|---|---|---|
| 3,907,973 A | 9/1975 | Kidde | |
| 4,299,804 A | 11/1981 | Parks et al. | |
| 2005/0093906 A1* | 5/2005 | Isono | ................... B41J 11/0065 347/14 |

FOREIGN PATENT DOCUMENTS

| | | |
|---|---|---|
| CN | 101615572 A | 12/2009 |
| CN | 105414119 A | 3/2016 |
| JP | 2005064199 | 3/2005 |

(Continued)

OTHER PUBLICATIONS machine translation of JP2012-018981A.*

(Continued)

*Primary Examiner* — Duy Vu N Deo
(74) *Attorney, Agent, or Firm* — Carter, DeLuca, Farrell & Schmidt, LLP

(57) ABSTRACT

Disclosed is a method of regenerating a phosphoric acid solution from a treatment liquid including silicon (Si), hydrogen fluoride (HF), and phosphoric acid, the method including removing the silicon by supplying hydrogen fluoride corresponding to a preset amount or more to the treatment liquid, removing the hydrogen fluoride by heating the treatment liquid to a boiling point of hydrogen fluoride or higher, and adjusting a temperature and a concentration of the phosphoric acid to preset values.

9 Claims, 8 Drawing Sheets

(56) References Cited

FOREIGN PATENT DOCUMENTS

| | | |
|---|---|---|
| JP | 4424517 | 6/2007 |
| JP | 2012018981 A * | 1/2012 |
| KR | 1020040090467 | 10/2004 |
| KR | 100907114 | 3/2008 |
| KR | 1020150037632 | 4/2015 |

OTHER PUBLICATIONS

Chinese Office Action dated Nov. 16, 2017 in corresponding Chinese Patent Application No. 201610369957.2 together with English translation, 18 pages.

Chinese Office Action dated Jul. 31, 2018 and issued in corresponding Chinese Patent Application No. 2016103699572, together with English translation.

* cited by examiner

SYSTEM AND METHOD FOR REGENERATING PHOSPHORIC ACID SOLUTION, AND APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2015-0076502 filed May 29, 2015, in the Korean Intellectual Property Office, the entire contents of which are hereby incorporated by reference.

BACKGROUND

The inventive concept relates to a system and a method for regenerating a phosphoric acid solution, and an apparatus and a method for treating a substrate.

In general, a semiconductor device is manufactured by repeating various unit processes such as deposition, photographing, etching, polishing, and cleaning. The cleaning process is a process of eliminating residuals, fine particles, contaminants, or unnecessary films, which reside on a surface of a semiconductor substrate when the unit processes are performed. In recent years, as the patterns formed in the substrate become finer, the importance of the cleaning process has been further increasing.

The cleaning process for the substrate includes a chemical solution treating process (chemical treating process) of etching or delaminating contaminants on the substrate by using a chemical reaction, a rinsing process of washing the chemically treated substrate with deionized water, and a drying process of drying the rinsed substrate. Various types of chemical solutions are used for the chemical treatment process, and a phosphoric acid solution is used to remove a silicon nitride film residing on the substrate with one of the chemicals.

However, etching efficiency is not good if the silicon nitride film is etched only by a phosphoric acid solution.

SUMMARY

The inventive concept provides a substrate treating apparatus and a substrate treating method by which a process of etching a silicon nitride film on a substrate is efficiently performed.

The inventive concept also provides a phosphoric acid solution regenerating system and a phosphoric acid solution regenerating method by which a phosphoric acid solution is generated from a used treatment liquid.

The aspect of the inventive concept is not limited thereto, and other unmentioned aspects of the inventive concept may be clearly appreciated by those skilled in the art from the following descriptions.

The inventive concept provides a phosphoric acid solution regenerating method.

In accordance with an aspect of the inventive concept, there is provided a method of regenerating a phosphoric acid solution from a treatment liquid including silicon (Si), hydrogen fluoride (HF), and phosphoric acid, the method including removing the silicon by supplying hydrogen fluoride corresponding to a preset amount or more to the treatment liquid, removing the hydrogen fluoride by heating the treatment liquid to a boiling point of hydrogen fluoride or higher, and adjusting a temperature and a concentration of the phosphoric acid to preset values.

According to an embodiment, the treatment liquid may circulate through a circulation line coupled to the housing while being accommodated in the housing.

According to an embodiment, the hydrogen fluoride corresponding to the preset amount or more in the removing of the silicon may be supplied to the circulation line.

According to an embodiment, in the removing of the hydrogen fluoride, the treatment liquid may be heated in the circulation line.

According to an embodiment, in the adjusting of the temperature and the concentration, the temperature may be adjusted by heating the treatment liquid in the circulation line.

According to an embodiment, in the adjusting of the temperature and the concentration, the concentration may be adjusted by supplying pure water to the circulation line.

According to an embodiment, the treatment liquid may circulate through the circulation line coupled to the housing while being accommodated in the housing, the hydrogen fluoride corresponding to the preset amount or more in the removing of the silicon is supplied to the circulation line, in the removing of the hydrogen fluoride, the treatment liquid is heated in the circulation line, and in the adjusting of the temperature and the concentration, the temperature is adjusted by heating the treatment liquid in the circulation line, and the concentration is adjusted by supplying pure water to the circulation line.

According to an embodiment, the removing of the silicon further may include measuring a concentration of the silicon, and if the concentration of the silicon may be a preset concentration or higher, the hydrogen fluoride is additionally supplied.

According to an embodiment, the removing of the hydrogen fluoride may include measuring a concentration of the hydrogen fluoride, and if the concentration of the hydrogen fluoride is a preset concentration or higher, the treatment liquid is continuously heated.

The inventive concept provides a phosphoric acid solution regenerating system.

In accordance with another aspect of the inventive concept, there is provided a phosphoric acid solution regenerating system including a regeneration tank that accommodates a treatment liquid including silicon (Si), hydrogen fluoride (HF), and phosphoric acid, a hydrogen fluoride supply unit that supplies hydrogen fluoride to the regeneration tank, and a heater provided in the regeneration tank to heat the treatment liquid.

According to an embodiment, the regeneration tank may include a housing that stores the treatment liquid including the silicon (Si), the hydrogen fluoride (HF), and the phosphoric acid, and a circulation line connected to the housing to circulate the treatment liquid in the housing, and the hydrogen fluoride supply unit may supply the hydrogen fluoride to the circulation line.

According to an embodiment, the phosphoric acid solution regenerating system may further include a pure water supply unit that adjusts a concentration of the phosphoric acid in the treatment liquid by supplying pure water to the circulation line.

According to an embodiment, the phosphoric acid solution regenerating system may further include a hydrogen fluoride concentration measuring member that measures a concentration of the hydrogen fluoride in the treatment liquid flowing through the circulation line.

According to an embodiment, the phosphoric acid solution regenerating system further include a controller that controls the hydrogen fluoride supply unit, and if the concentration of the silicon is a preset concentration or higher, the controller may additionally supply the hydrogen fluoride.

According to an embodiment, the phosphoric acid solution regenerating system may further include a controller that controls the heater, and if the concentration of the hydrogen fluoride is a preset concentration or higher, the controller may circulate the treatment liquid while continuously heating the treatment liquid.

According to an embodiment, the phosphoric acid solution regenerating system may further include a pure water supply unit that adjusts a concentration of the phosphoric acid in the treatment liquid by supplying pure water to the circulation line, a silicon concentration measuring member that measures a concentration of the silicon in the treatment liquid, and a hydrogen fluoride concentration measuring member that measures a concentration of the hydrogen fluoride in the treatment liquid.

According to an embodiment, the phosphoric acid solution regenerating system may further include a phosphoric acid concentration measuring member that measures the concentration of the phosphoric acid in the treatment liquid.

According to an embodiment, the phosphoric acid solution regenerating system further include a concentration measuring line branched from the circulation line and connected to the housing, and a cooler provided in the concentration measuring line, and the silicon concentration measuring member, the hydrogen fluoride concentration measuring member, and the phosphoric acid concentration measuring member may be provided in the concentration measuring line, the silicon concentration measuring member may be provided on a front side of the cooler, and the hydrogen fluoride concentration measuring member and the phosphoric acid concentration measuring member may be provided on a rear side of the cooler.

According to an embodiment, the phosphoric acid solution regenerating system may further include a controller that controls the hydrogen fluoride supply unit and the heater, if the concentration of the silicon is a preset concentration or higher, the controller additionally may supply the hydrogen fluoride, and if the concentration of the hydrogen fluoride is a preset concentration or higher, may circulate the treatment liquid while continuously heating the treatment liquid.

The inventive concept provided a substrate treating method.

In accordance with another aspect of the inventive concept, there is provided a method for treating a substrate, including etching a silicon nitride film by supplying a treatment liquid including a first solution and a second solution onto the substrate, and the first solution may include phosphoric acid, and the second solution includes silicon, hydrogen fluoride, and phosphoric acid.

According to an embodiment, a temperature of the first solution may be 160° C. to 180° C., and a temperature of the second solution may be 10° C. to 30° C.

According to an embodiment, the first solution and the second solution may be supplied to the substrate after being inline-mixed.

According to an embodiment, the phosphoric acid solution may be regenerated from the treatment liquid used in treatment of the substrate.

The inventive concept provides a substrate treating method.

In accordance with another aspect of the inventive concept, there is provided an apparatus for etching a silicon nitride film of a substrate, the apparatus including a cup that provides a treatment space for treating the substrate, a support unit that supports the substrate in the treatment space, an injection unit that supplies a treatment liquid including silicon, hydrogen fluoride, and phosphoric acid onto an upper surface of the substrate, and a treatment liquid supply unit that supplies the treatment liquid to the injection unit.

According to an embodiment, the treatment liquid may be a mixed liquid in which a first solution and a second solution are mixed, the first solution may be a solution of a temperature of 160° C. to 180° C. including phosphoric acid, and the second solution may be a solution of a temperature of 10° C. to 30° C. including silicon, hydrogen fluoride, and phosphoric acid.

According to an embodiment, the treatment liquid supply unit may include a first supply line that supplies a first solution including phosphoric acid, a second supply line that supplies a second solution including phosphoric acid, silicon, and hydrogen fluoride, and a treatment liquid supply line that supplies the treatment liquid to the injection unit, and the first supply line and the second supply line may be connected to each other, and the treatment liquid supply line may be provided with an inline-mixer that mixes the first solution and the second solution.

According to an embodiment, the apparatus may further include a phosphoric acid solution regenerating system that regenerates a phosphoric acid solution from the treatment liquid.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Hereinafter, exemplary embodiments of the inventive concept will be described in detail with reference to FIGS. 1 to 5.

Figure 1:
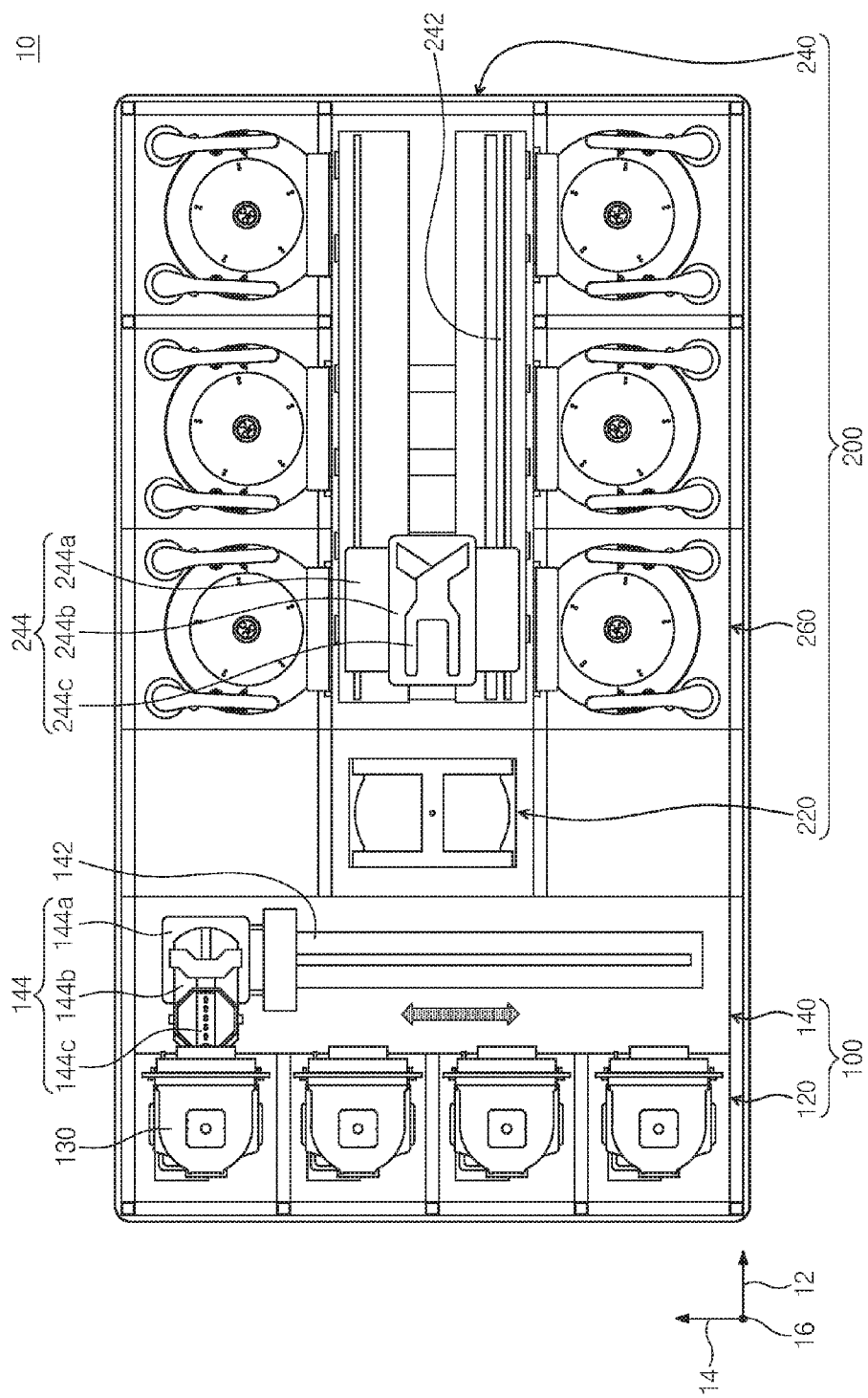
FIG. 1 is a plan view schematically illustrating a substrate treating system provided with a substrate treating apparatus according to an embodiment of the inventive concept.

FIG. 1 is a plan view schematically illustrating a substrate treating system 1 according to the inventive concept.

Referring to FIG. 1, the substrate treating system 1 includes an index module 100 and a process treating module 200. The index module 100 includes a plurality of load ports 120 and a feeding frame 140. The load port 120, the feeding frame 140, and the process treating module 200 may be sequentially arranged in a row. Hereinafter, a direction in which the load port 120, the feeding frame 140, and the process treating module 200 will be referred to a first direction 12. A direction perpendicular to the first direction 12 when viewed from the top will be referred to as a second direction 14, and a direction normal to a plane including the first direction 12 and the second direction 14 will be referred to as a third direction 16.

A carrier 130, in which a substrate W is received, is seated on the load port 120. A plurality of load ports 120 are provided, and are arranged along the second direction 14 in a row. FIG. 1 illustrates that four load ports 120 are provided. However, the number of the load ports 120 may increase or decrease according to a condition, such as the process efficiency of the process treating module 200 or a footprint. A plurality of slots (not illustrated) provided to support peripheries of substrates W are formed in the carrier 130. A plurality of slots are provided in the third direction 16. The substrates W are stacked in the carrier 130 while being spaced apart from each other along the third direction 16. A front opening unified pod (FOUP) may be used as the carrier 130.

The process treating module 200 includes a buffer unit 220, a feeding chamber 240, and a plurality of process chambers 260. The feeding chamber 240 is arranged such that the lengthwise direction thereof is in parallel to the first direction 12. The process chambers 260 are arranged on opposite sides of the feeding chamber 240 along the second direction 14. The process chambers situated on one side of the feeding chamber 240 and the process chambers 260 situated on an opposite side of the feeding chamber 240 are symmetrical to each other with respect to the feeding chamber 240. Some of the process chambers 260 are arranged along the lengthwise direction of the feeding chamber 240. Furthermore, some of the process chambers 260 are arranged to be stacked on each other. That is, the process chambers 260 having an array of A by B (A and B are natural numbers) may be arranged on one side of the feeding chamber 240. Here, A is the number of the process chambers 260 provided in a row along the first direction 12, and B is the number of the process chambers 260 provided in a row along the third direction 16. When four or six process chambers 260 are provided on one side of the feeding chamber 240, the process chambers 260 may be arranged in an array of 2 by 2 or 3 by 2. The number of the process chambers 260 may increase or decrease. Unlike the above-mentioned description, the process chambers 260 may be provided only on one side of the feeding chamber 240. Further, unlike the above-mentioned description, the process chambers 260 may be provided on one side or opposite sides of the feeding chamber 240 to form a single layer.

A buffer unit 220 is arranged between the feeding frame 140 and the feeding chamber 240. The buffer unit 220 provides a space in which the substrates W stay before being transported, between the feeding chamber 240 and the feeding frame 140. Slots (not illustrated) in which the substrates W is positioned are provided in the buffer unit 220, and a plurality of slots (not illustrated) are provided to be spaced apart from each other along the third direction 16. Faces of the buffer unit 220 that faces the feeding frame 140 and faces the feeding chamber 240 are opened.

The feeding frame 140 transports the substrates W between the carrier 130 seated on the load port 120 and the buffer unit 220. An index rail 142 and an index robot 144 are provided in the feeding frame 140. The index rail 142 is arranged such that the lengthwise direction thereof is in parallel to the second direction 14. The index robot 144 is installed on the index rail 142, and is linearly moved in the second direction 14 along the index rail 142. The index robot 144 has a base 144*a*, a body 144*b*, and a plurality of index arms 144*c*. The base 144*a* is installed to be moved along the index rail 142. The body 144*b* is coupled to the base 144*a*. The body 144*b* is provided to be moved along the third direction 16 on the base 144*a*. The body 144*b* is provided to be rotated on the base 144*a*. The index arms 144*c* are coupled to the body 144*b*, and are provided to be moved forwards and rearwards with respect to the body 144*b*. A plurality of index arms 144*c* are provided to be driven individually. The index arms 144*c* are arranged to be stacked so as to be spaced apart from each other along the third direction 16. Some of the index arms 144*c* are used when the substrates W are transported to the carrier 130 in the process treating module 200, and some of the index arms 155 may be used when the substrates W are transported from the carrier 130 to the process treating module 200. This structure may prevent particles generated from the substrates W before the process treatment from being attached to the substrates W after the process treatment in the process of carrying the substrates W in and out by the index robot 144.

The feeding chamber 240 transports the substrates W between the buffer unit 220 and the process chambers 260, and between the process chambers 260. A guide rail 242 and a main robot 244 are provided in the feeding chamber 240. The guide rail 242 is arranged such that the lengthwise direction thereof is in parallel to the first direction 12. The main robot 244 is installed on the guide rail 242, and is linearly moved along the first direction 12 on the index rail 242. The main robot 244 has a base 244*a*, a body 244*b*, and a plurality of main arms 244*c*. The base 244*a* is installed to be moved along the guide rail 242. The body 244*b* is coupled to the base 244*a*. The body 244*b* is provided to be moved along the third direction 16 on the base 244*a*. The body 244*b* is provided to be rotated on the base 244*a*. The main arms 244*c* are coupled to the body 244*b*, and are provided to be moved forwards and rearwards with respect to the body 244*b*. A plurality of main arms 244*c* are provided to be driven individually. The main arms 244*c* are arranged to be stacked so as to be spaced apart from each other along the third direction 16. The main arms 244*c* used when the substrates W are transported from the buffer unit 220 to the process chambers 260 and the main arms 244 used when the substrates W are transported from the process chambers 260 to the buffer unit 220 may be different.

Substrate treating apparatuses 10 that perform cleaning processes on the substrates W are provided in the process chambers 260. The substrate treating apparatuses 10 provided in the process chambers 260 may have different structures according to the types of performed cleaning processes. Selectively, the substrate treating apparatuses 10 in the process chambers 260 may have the same structure. Selectively, the process chambers 260 may be classified into a plurality of groups such that the substrate treating apparatuses 10 provided in the process chambers 260 pertaining to the same group have the same structure and the substrate treating apparatuses 10 provided in the process chambers 260 pertaining to different groups has different structures. For example, when the process chambers 260 are classified into two groups, the first group of process chambers 260 may be provided on one side of the feeding chamber 240 and the second group of process chambers 260 may be provided on an opposite side of the feeding chamber 240. Selectively, the first group of process chambers 260 may be provided on the lower side of the feeding chamber 240 and the second group of process chambers 260 may be provided on the upper side of the feeding chamber 240, on opposite sides of the feeding chamber 240. The first group of process chambers 260 and the second group of process chambers 260 may be classified according to the kinds of the used chemicals or the types of cleaning methods.

Figure 2:
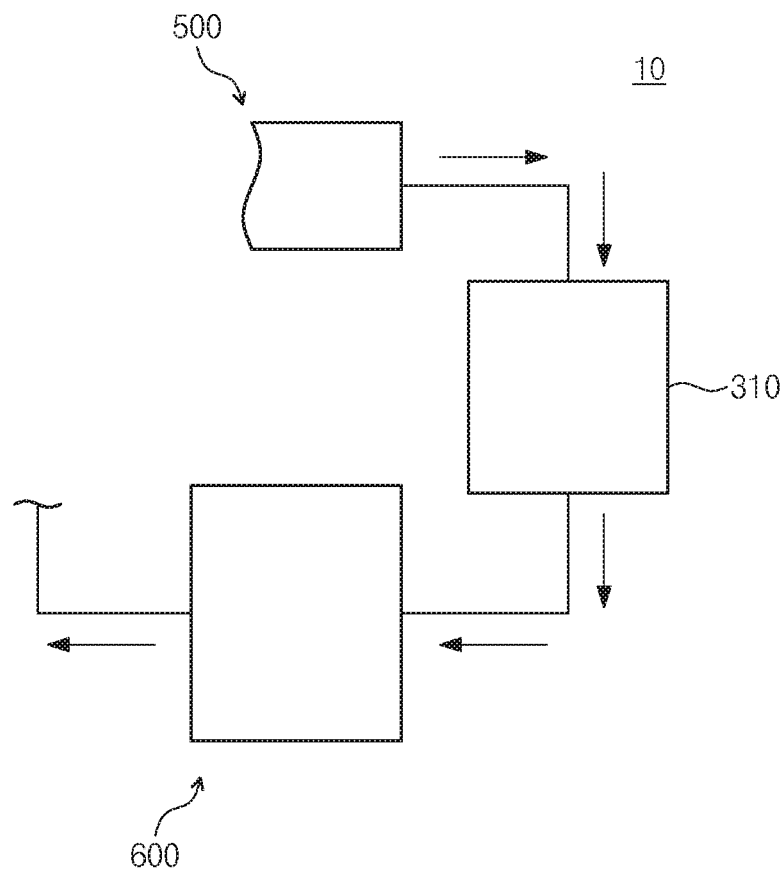
FIG. 2 is a view schematically illustrating an embodiment of a substrate treating apparatus.
Figure 3:
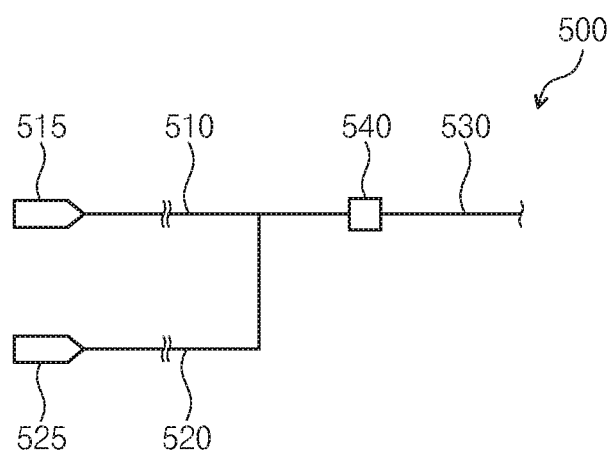
FIG. 3 is a view illustrating a treatment liquid supply unit of FIG. 2.
Figure 4:
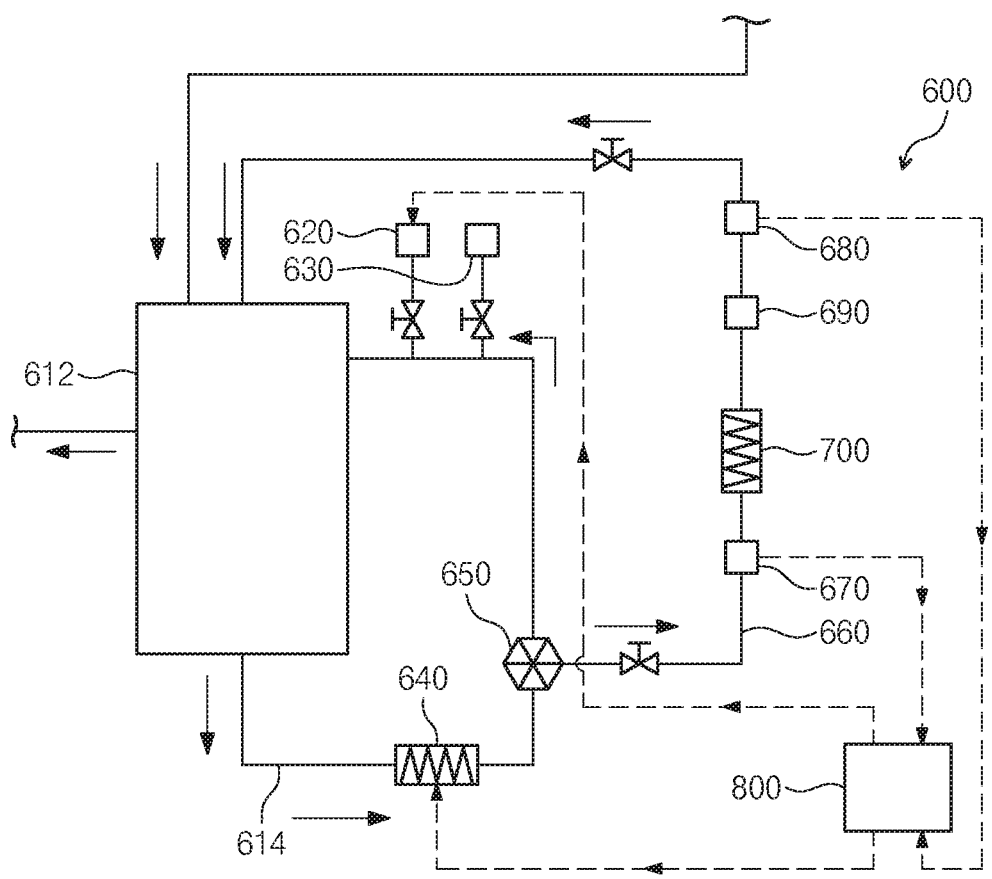
FIG. 4 is a view illustrating a phosphoric acid solution regenerating system of FIG. 2.
Figure 5:
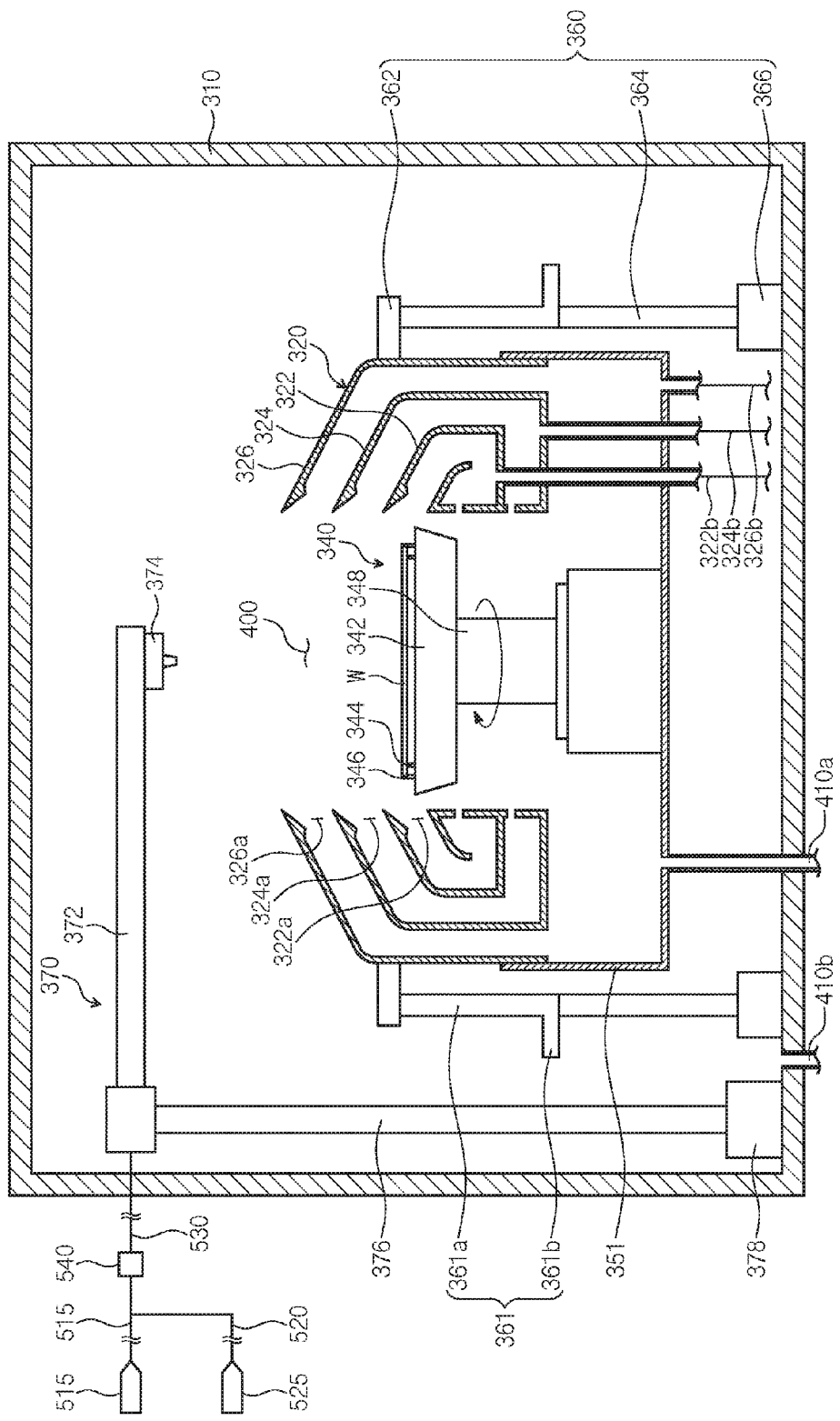
FIG. 5 is a view illustrating a chamber of FIG. 2.

Hereinafter, an example of a substrate treating apparatus 10 that treats a substrate W by using a treatment liquid will be described. FIG. 2 is a schematic view illustrating an example of the substrate treating apparatus 10. FIG. 3 is a view illustrating a treatment liquid supply unit 500. FIG. 4 is a view illustrating a phosphoric acid solution regenerating system 600. FIG. 5 is a view illustrating a chamber 310.

Referring to FIGS. 2 to 5, the substrate treating apparatus 10 includes a chamber 310, a treatment liquid supply unit 500, and a phosphoric acid solution regenerating system 600.

The chamber 310 includes a cup 320, a support unit 340, an injection unit 370, and an exhaust unit 410.

The chamber 310 provides a space in the interior thereof. A cup 320 is situated in the space in the chamber 310, and provides a treatment space 400 in which a substrate treating process is performed. The upper side of the treatment space 400 is opened.

The cup 320 has an inner recovery vessel 322, an intermediate recovery vessel 324, and an outer recovery vessel 326. The recovery vessels 322, 324, and 326 recover different treatment liquids used in the process. The inner recovery vessel 322 has an annular ring shape that surrounds the support unit 340, the intermediate recovery vessel 324 has an annular ring shape that surrounds the inner recovery vessel 322, and the outer recovery vessel 326 has an annular ring shape that surrounds the intermediate recovery vessel 324. The entire cup 320 may be moved upwards and downwards, and the recovery vessels 322, 324, and 326 may be moved upwards and downwards independently. An inner space 322a of the inner recovery vessel 322, a space 324a between the inner recovery vessel 322 and the intermediate recovery vessel 324, and a space 326a between the intermediate recovery vessel 324 and the outer recovery vessel 326 function as inlets through which the treatment fluids are introduced into the inner recovery vessel 322, the intermediate recovery vessel 324, and the outer recovery vessel 326. Because the recovery vessels 322, 324, and 326 may be moved upwards and downwards independently, it may be such that when any one of the inner space 322a and the intermediate spaces 324a and 326a is opened, the remaining spaces may be closed.

Recovery lines 322b, 324b, and 326b extending from the recovery vessels 322, 324, and 326 perpendicularly in the downward direction of the bottom surfaces thereof are connected to the recovery vessels 322, 324, and 326, respectively. The recovery lines 322b, 324b, and 326b discharge the treatment fluids introduced through the recovery vessels 322, 324, 326, respectively. The discharged treatment fluids may be reused through an external treatment fluid recycling system (not illustrated).

The support unit 340 is arranged in the cup 320. The support unit 340 supports and rotates the substrate W during the process. The support unit 340 includes a support plate 342, a plurality of support pins 344, a plurality of chuck pins 346, and a support shaft 348. The support plate 342 has an upper surface having a substantially circular shape when viewed from the top. The support shaft 348 that may be rotated by a motor 349 is fixedly coupled to the bottom of the support plate 342. A plurality of support pins 344 are provided. The support pins 344 may be arranged to be spaced apart from each other at a periphery of the upper surface of the support plate 342 and protrude upwards from the support plate 342. The support pins 334 are arranged to have a generally annular ring shape through combination thereof. The support pins 344 support a periphery of a rear surface of the substrate W such that the substrate W is spaced apart from the upper surface of the support plate 342 by a predetermined distance. A plurality of chuck pins 346 are provided. The chuck pins 346 are arranged to be more distant from the center of the support plate 342 than the support pins 344. The chuck pins 346 are provided to protrude upwards from the support plate 342. The chuck pins 346 support a side of the substrate W such that the substrate W is not separated laterally from a proper place when the support unit 340 is rotated. The chuck pins 346 are provided to be linearly moved between a standby position and a support position along a radial direction of the support plate 342. The standby position is a position that is more distant from the center of the support plate 342 than the support position. When the substrate W is loaded on or unloaded from the support unit 340, the chuck pins 346 are located at the standby position, and when a process is performed on the substrate W, the chuck pins 346 are located at the support position. The chuck pins 346 are in contact with the side of the substrate W at the support position.

The injection unit 370 supplies a treatment fluid to the substrate W during a substrate treating process. The treatment fluid includes a chemical, a rinsing liquid, and a drying fluid. The injection unit 370 has a nozzle support 372, a nozzle 374, a support shaft 376, and a driver 378. The lengthwise direction of the support shaft 376 is provided along the third direction 16, and the driver 378 is coupled to a lower end of the support shaft 376. The driver 378 rotates and elevates the support shaft 376. The nozzle support 372 is vertically coupled to an end opposite to an end of the support shaft 376 coupled to the driver 378. The nozzle 374 is installed on the bottom surface of an end of the nozzle support 372. The nozzle 374 is moved to a process location and a standby location by the driver 378. The process location is a location at which the nozzle 374 is arranged at a vertical upper portion of the cup 320, and the standby location is a location that deviates from the vertical upper portion of the cup 320. The nozzle may include a treatment liquid nozzle that injects a treatment liquid, a rinsing liquid that injects a rinsing liquid, and a drying nozzle that injects a drying fluid.

The treatment liquid is a mixed liquid of a first solution and a second solution. The first solution and the second solution may be inline-mixed. The first solution includes a phosphoric acid. The first solution may be supplied at 160° C. to 180° C. The second solution includes silicon (Si), hydrogen fluoride (HF), and phosphoric acid. The second solution may be a solution at room temperature (10° C. to 30° C.). For example, the first solution is a phosphoric acid solution, and the second solution is a mixed solution of silicon (Si), hydrogen fluoride (HF), and phosphoric acid.

According to the related art, a substrate treating process is performed while taking a phosphoric acid solution of 160° C. to 180° C. such as the first solution as the treating liquid. However, the inventive concept uses a mixed solution of room temperature including silicon (Si), hydrogen fluoride (HF), and phosphoric acid, as well as a phosphoric acid solution, to improve substrate treating efficiency.

Among the components of the second solution, hydrogen fluoride (HF) is used to increase the etching rate of a silicon nitride film ($Si_3N_4$), and the silicon (Si) may prevent an oxide film formed through atomic layer deposition from being etched. Accordingly, the precision and efficiency of the substrate treatment increase.

The rinsing liquid may be pure water. The drying fluid may be a mixture of isopropyl alcohol vapor, alcohol vapor, and an inert gas, or an isopropyl alcohol liquid.

The exhaust unit 410 exhausts foreign substances, such as, fume generated during the substrate treating process and the treatment fluid through air flows. The exhaust unit 410 has a first exhaust member 410a and a second exhaust member 410b. The first exhaust member 410a exhausts fluids from the interior of the treatment space 400 of the cup 320. The first exhaust member 410a is connected to the bottom surface of the cup 320. The second exhaust member 410b exhausts fluids from a space between the cup 320 and the chamber 310. The second exhaust member 410b is connected to the bottom surface of the chamber 310.

The treatment liquid supply unit 500 supplies the treatment liquid into the chamber 310. Further, the treatment liquid supply unit 500 receives and stores the phosphoric acid solution regenerated by the phosphoric acid solution regenerating system 600

The treatment liquid supply unit 500 includes a first supply line 510, a second supply line 520, a treatment liquid supply line 530, and an inline mixer 540. The first supply line 510 is connected to a first solution supply unit 515 to receive a first solution. The second supply line 520 is connected to a second solution supply unit 525 to receive a second solution. The first supply line 510 and the second supply line 520 are connected to each other, and are merged to the treatment liquid supply line 530. The treatment liquid supply line 530 supplies the treatment liquid to the injection unit 370. The treatment liquid supply line 530 may be provided with the inline mixer 540 that may inline-mix the first solution and the second solution.

The phosphoric acid solution system 600 includes a regeneration tank 610, a hydrogen fluoride supply unit 620, a pure water supply unit 630, a heater 640, a filter 650, a concentration measuring line 660, a silicon concentration measuring member 670, a hydrogen fluoride concentration measuring member 680, a phosphoric acid concentration measuring member 690, a cooler 700, and a controller 800.

The regeneration tank 610 accommodates silicon, hydrogen fluoride, and phosphoric acid. The regeneration tank 610 includes a housing 612 and a circulation line 614. The housing 612 provides a space for storing a treatment liquid discharged from the chamber 310. Silicon (Si) and hydrogen fluoride (HF) are removed from the circulation line 614 while the treatment liquid in the housing 612 circulates. The circulation line 614 is connected to the housing 612 to circulate the treatment liquid in the housing 612. The treatment liquid stored in the housing 612 may be regenerated while circulating through the circulation line 614.

The hydrogen fluoride supply unit 620 supplies hydrogen fluoride (HF) to the circulation line 614 to remove silicon (Si) from the treatment liquid.

The pure water supply unit 630 supplies pure water to the treatment liquid flowing through the circulation line 614 to adjust the concentration of the regenerated phosphoric acid solution.

The heater 640 heats the treatment liquid flowing through the circulation line 614. The heater 640 may be provided in the circulation line 614. The heater 640 may heat the treatment liquid up to 160° C. to 180° C.

The filter 650 removes impurities in the treatment liquid discharged from the chamber 310. The filter 650 may be provided in the circulation line 614.

A small amount of treatment liquid for measuring the concentrations of silicon (Si), hydrogen fluoride (HF), and phosphoric acid flows through the concentration measuring line 660. The concentration measuring line 660 may be branched from the circulation line 614, and may be connected to the housing 612.

The silicon concentration measuring member 670 measures the concentration of silicon (Si) in the treatment liquid. The hydrogen fluoride concentration measuring member 680 measures the concentration of hydrogen fluoride (HF) in the treatment liquid. The phosphoric acid concentration measuring member 690 measures the concentration of phosphoric acid in the treatment liquid. The concentration measuring members 670, 680, and 690 may be provided in the concentration measuring line 660.

The cooler 700 cools the treatment liquid. The cooler 700 may be provided in the concentration measuring line 660. The cooler 700 may be provided in the phosphoric acid concentration measuring member 690 while the treatment liquid is cooled. The cooler 700 may be provided in the hydrogen fluoride concentration measuring member 680 while the treatment liquid is cooled. The concentrations of hydrogen fluoride (HF) and phosphoric acid may be precisely measured at 80° C. to 120° C. Meanwhile, because the temperature of the treatment liquid flowing through the circulation line 614, the treatment liquid is cooled before the treatment liquid reaches the phosphoric acid concentration measuring member 690 and the hydrogen fluoride concentration measuring member 680. The cooler 700 may be provided in the concentration measuring line 660 in consideration of the flows of the treatment liquid. For example, the cooler may be provided between the silicon concentration measuring member 670 and the phosphoric acid concentration measuring member 690. Further, the cooler may be provided between the silicon concentration measuring member 670 and the hydrogen fluoride concentration measuring member 680. Accordingly, when the flows of the treatment liquid is considered, the silicon concentration measuring member 670 is provided on the front side of the cooler 700 and the hydrogen fluoride concentration measuring member 680 and the phosphoric acid concentration measuring member 690 are provided on the rear side of the cooler 700.

The controller 800 controls the hydrogen fluoride supply unit 620 and the heater 640. If the concentration of silicon (Si) in the treatment liquid measured by the silicon concentration measuring member 670 is a preset concentration or higher, hydrogen fluoride (HF) is additionally supplied from the hydrogen fluoride supply unit 620 to the circulation line 614. If the concentration of hydrogen fluoride (HF) in the treatment liquid measured by the hydrogen fluoride concentration measuring member 680 is a preset concentration or higher, the heater 640 circulates the treatment liquid through the circulation line 614 while being continuously heated by the heater 640.

Hereinafter, a substrate treating process and a phosphoric acid solution regenerating process will be described with reference to FIGS. 2 to 8. The arrows indicate flows of the treatment liquid.

A first solution is supplied from the treatment liquid supply unit 500 through the first supply line 510, and a second solution is supplied through the second supply line 520. The first solution supply unit 515 is connected to the first supply line 510, and the second solution supply unit 525 is connected to the second supply line 520.

The first supply line 510 and the second supply line 520 are connected to each other, and are inline-mixed on the treatment liquid supply line 530. The treatment liquid in which the first solution and the second solution are mixed is supplied to the injection unit 370 through the treatment liquid supply line 530. The treatment liquid is injected onto a surface of the substrate through the injection unit 370 to treat the substrate. Then, the hydrogen fluoride (HF) component of the treatment liquid increases the effect of etching a silicon nitride film ($Si_3N_4$). The silicon (Si) of the treatment liquid prevents an oxide film formed through atomic layer deposition from being etched.

The treatment liquid used to process the substrate in the chamber 310 is introduced into the housing 612, and a phosphoric acid solution regenerating process of regenerating a phosphoric acid solution from the used treatment liquid. The treatment liquid circulates along the circulation line 614. The heater 640 heats the treatment liquid flowing through the circulation line 614 up to 160° C. to 180° C. The filter 650 filters side-products from the used treatment liquid.

A silicon removing operation S100 of removing silicon from the used treatment liquid is performed. Hydrogen fluoride is provided from the hydrogen fluoride supply unit 620 to the circulation line 614 and chemically reacts with silicon (Si) in the treatment liquid. Silicon (Si) and hydrogen fluoride (HF) react with each other into tetra fluoro silicon ($SiF_4$), which is evaporated in the form of gas. The evaporated gas may be exhausted by a separate exhaust line (not illustrated). Accordingly, silicon (Si) may be removed. Further, hydrogen fluoride (HF) that reacted with silicon (Si) is also removed. Hydrogen fluoride (HF) is supplied to induce a chemical reaction until the concentration of silicon (Si) becomes a preset value or less, which will be described below. The related chemical formula is as follows.

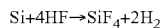

$Si+4HF \rightarrow SiF_4+2H_2$     [Chemical formula 1]

Silicon (Si) is removed by using the chemical reaction of Chemical formula 1. The silicon (Si) removed then includes the silicon (Si) component removed from the substrate as well as the silicon (Si) component included in the treatment liquid from the beginning. Further, the supplied hydrogen fluoride (HF) reacts with silicon and is removed together.

In consideration of Chemical formula 1 and the molecular weights of silicon (Si) and hydrogen fluoride (HF), hydrogen fluoride (HF) corresponding to a preset amount or more may be supplied. The preset amount refers to a minimum amount of hydrogen fluoride (HF) that may react with silicon (Si) and remove all silicon (Si). The oversupplied hydrogen fluoride (HF) resides even after silicon (Si) is removed. The residing hydrogen fluoride (HF) is evaporated into gas to be removed, through heating of the heater 640.

The heater 640 continuously heats the treatment liquid flowing through the circulation line 614 up to 160° C. to 180° C.

Figure 6:
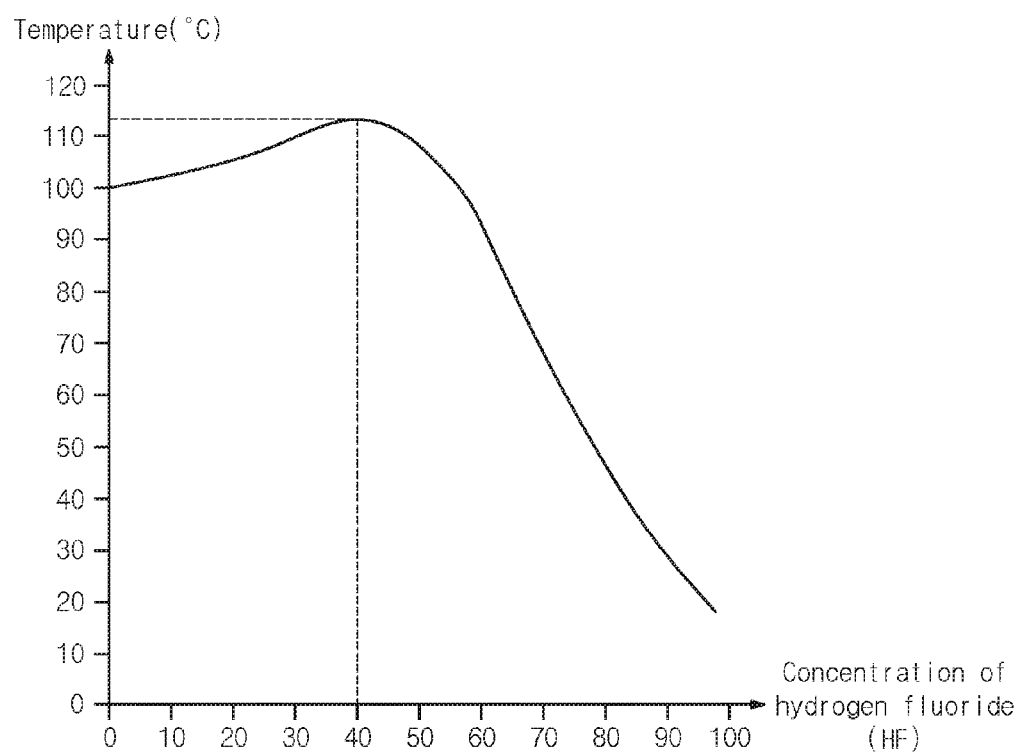
FIG. 6 is a graph depicting boiling points of liquefied hydrogen fluoride (HF) according the concentrations of hydrogen fluoride (HF) in a hydrogen fluoride (HF) solution.
Figure 7:
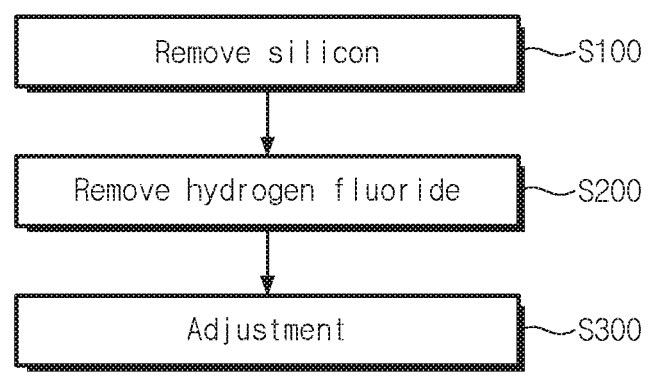
FIG. 7 is a flowchart illustrating an operation of regenerating a phosphoric acid solution.

FIG. 6 is a graph illustrating a boiling point of liquefied hydrogen fluoride (HF) existing in the treatment liquid. Referring to FIG. 6, a hydrogen fluoride removing operation S200 will be described. Referring to FIG. 4, the boiling point of the hydrogen fluoride (HF) may vary according to the concentration thereof, but is formed at a maximum of about 120° C. The temperature of the treatment liquid flowing through the circulation line 614 is increased to 160° C. to 180° C. by a heater. Accordingly, hydrogen fluoride (HF) may be evaporated into gas and then is removed. The evaporated gas may be exhausted by a separate exhaust line (not illustrated). The hydrogen fluoride removing operation S200 may be performed at the same time when the silicon removing operation S100 is performed, and may be continuously performed through heating even after the silicon removing operation S100 is completed.

It is identified whether silicon (Si) and hydrogen fluoride (HF) have been removed from the treatment liquid to a preset value. To achieve this, the concentrations of silicon (Si) and hydrogen fluoride (HF) of the treatment liquid flowing through the circulation line 614 are measured. If the concentrations of silicon (Si) and hydrogen fluoride (HF) are preset values or less, it is determined that the phosphoric acid solution has been completely regenerated.

A temperature and concentration adjusting operation S300 of adjusting a temperature and a concentration of the phosphoric acid solution, from which silicon and hydrogen fluoride have been completely removed, is performed. The preset temperature may be 160° C. to 180° C. The preset concentration may be 90% to 92%. The preset temperature may be adjusted through the heater 640, and the preset concentration may be adjusted by supplying pure water from the pure water supply unit 630.

Figure 8:
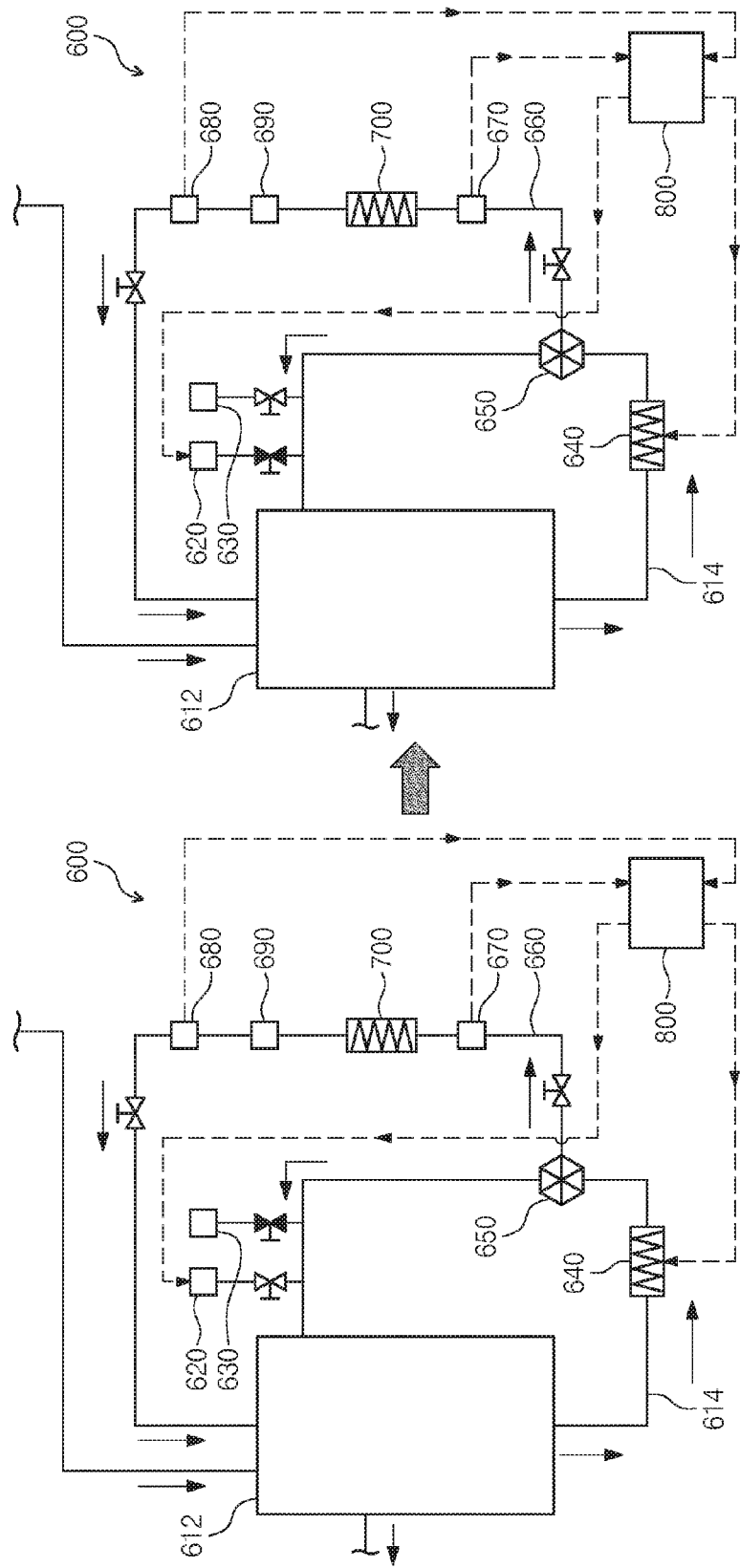
FIG. 8 is a view illustrating a phosphoric acid solution regenerating system according to the operation of regenerating a phosphoric acid solution in FIG. 7.

According to an embodiment, as illustrated in FIG. 8, the supply of hydrogen fluoride or pure water may be made by opening and closing valves installed in the hydrogen fluoride supply unit 620 and the pure water supply unit 630.

Hereinafter, a process of measuring the concentrations of silicon (Si) and hydrogen fluoride (HF), by which it may be identified whether silicon and hydrogen fluoride have been removed through the silicon removing operation S100 and the hydrogen fluoride removing operation S200 will be described. Further, a process of measuring the concentration of phosphoric acid, by which it is identified whether a suitable concentration of phosphoric acid is reached through the temperature and concentration adjusting operation S300 will be described together.

A small amount of treatment liquid of the treatment liquid flowing through the circulation line 614 may be branched from the circulation line 614 to flow to the concentration measuring line 660. The concentration of silicon (Si) may be measured through the silicon concentration measuring member 670 provided in the concentration measuring line 660. It is identified whether the concentration of silicon (Si) is a preset value or less. For example, the preset value for the concentration of silicon (Si) may be 10 ppm. When the concentration of silicon (Si) is the preset value or less, the residing silicon (Si) hardly influences the treatment of the substrate. If the concentration of silicon (Si) is 10 ppm or less, it may be determined that the silicon (Si) has been completely removed. If the concentration of silicon (Si) exceeds 10 ppm, hydrogen fluoride (HF) may be additionally supplied from the hydrogen fluoride supply unit 620 to remove silicon (Si).

Thereafter, the phosphoric acid concentration measuring member 690 and the hydrogen fluoride concentration measuring member 680, which are arranged along the concentration measuring line 660, may measure the concentrations of phosphoric acid and hydrogen fluoride. Meanwhile, the concentrations of phosphoric acid and hydrogen fluoride (HF) may be precisely measured when the temperature of the treatment liquid is 80° C. to 120° C. However, the treatment liquid flowing through the circulation line 614 maintains a temperature of 160° C. to 180° C. by using the heater 640. Accordingly, the treatment liquid needs to be cooled for measuring the concentrations of phosphoric acid and hydrogen fluoride.

Accordingly, the cooler 700 may be provided in the concentration measuring line 660 at a location at which the treatment has passed through the silicon concentration measuring member 670. After the treatment liquid is cooled by the cooler 700, the cooled treatment liquid passes through the phosphoric acid concentration member 690 and the hydrogen fluoride concentration measuring member 680.

The phosphoric acid concentration measuring member 690 determines whether the concentration of the regenerated phosphoric acid solution is suitable for supplying the regenerated phosphoric acid solution to the chamber 310. The phosphoric acid concentration measuring member 690 determines whether the concentration of phosphoric acid is a preset concentration or less. For example, the preset concentration may be 90% to 92%. After the regeneration process, the concentration of phosphoric acid becomes higher than the concentration of the phosphoric acid in the treatment liquid introduced initially due to the consistent heating of the heater 640. For example, the concentration of the phosphoric acid solution, on which the regeneration process has been performed, may be 92% or more. Accordingly, the concentration of the phosphoric acid solution may be lowered to 90% to 92% by supplying pure water to the circulation line 614 through the pure water supply unit 630.

The hydrogen fluoride concentration measuring member 680 identifies whether hydrogen fluoride (HF) has been removed, by measuring the concentration of the hydrogen fluoride (HF) in the treatment liquid. The hydrogen fluoride concentration measuring member 680 identifies whether the concentration of the hydrogen fluoride (HF) is a preset value or less. For example, the preset value for the concentration of hydrogen fluoride (HF) may be 2 ppm. When the concentration of hydrogen fluoride (HF) is the preset value or less, the residing hydrogen fluoride (HF) hardly influences the treatment of the substrate. If the concentration of hydrogen fluoride (HF) is 2 ppm or less, it may be determined that the hydrogen fluoride (HF) has been completely removed. If the concentration of silicon (Si) exceeds 2 ppm, the controller 800 controls the heater 640 such that the heater 640 continues to heat the treatment liquid, and performs a control such that the treatment liquid undergoes a regeneration process while being continuously circulated through the circulation line 614.

Although it has been described in the above-described embodiment that the concentration measuring line 660 is separately provided, the concentration measuring line 660 may be omitted. Then, the silicon concentration measuring member 670, the hydrogen fluoride concentration measuring member 680, the phosphoric acid concentration measuring member 690, and the cooler 700 may be provided in the circulation line 614.

Figure 9:
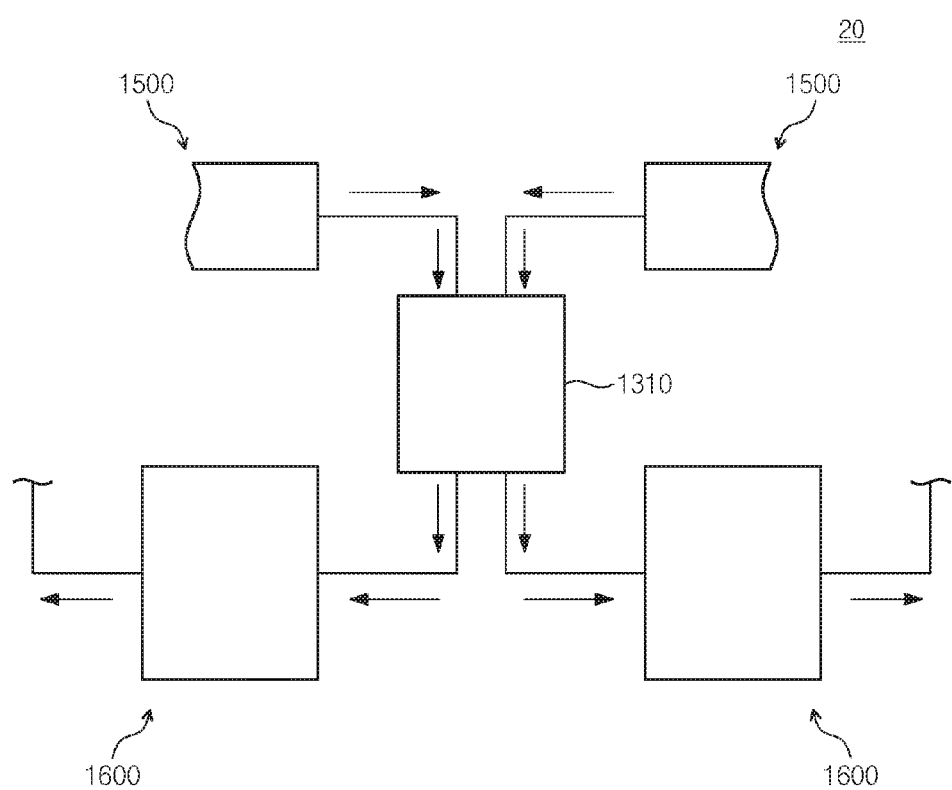
FIG. 9 is a view schematically illustrating another embodiment of a substrate treating apparatus.

FIG. 9 is a schematic view illustrating another example of the substrate treating apparatus 20.

Although it has been described in the above-described embodiment that one phosphoric acid solution regenerating system is provided, a plurality of phosphoric acid solution regenerating systems 1600 may be provided. For example, a pair of phosphoric acid solution regenerating systems 1600 may be provided. Then, while one phosphoric acid solution regenerating system 1600 regenerates a phosphoric acid solution from the used treatment liquid, the other phosphoric acid solution regenerating system 1600 may supply the regenerated phosphoric acid solution to the treatment liquid supply unit.

Further, unlike the above-described embodiment, the phosphoric acid solution regenerating system 600 may be omitted.

In the substrate treating method according to the inventive concept, the substrate is treated by the mixed treatment liquid in which a phosphoric acid solution of a temperature of 160° C. to 180° C. and a solution of room temperature (10° C. to 30° C.) including silicon (Si), hydrogen fluoride (HF), and phosphoric acid, and a phosphoric acid solution is regenerated from the used treatment liquid.

The substrate is treated by using the treatment liquid. Hydrogen fluoride (HF) is used to increase the etching rate of a silicon nitride film ($Si_3N_4$), and silicon (Si) prevents an oxide film from being etched by atomic layer deposition. Accordingly, the precision and efficiency of the substrate treatment increase.

A silicon removing operation S100 of removing silicon (Si) from the used treatment liquid is performed. The silicon (S) is removed by a chemical reaction by supplying hydrogen fluoride (HF) corresponding to a preset amount or more. Then, hydrogen fluoride (HF) that reacted with silicon (Si), as well as silicon (Si) also are removed. The preset amount of the hydrogen fluoride (HF) refers to a minimum amount for evaporating silicon (Si) into tetra fluoro silicon ($SiF_4$) by reacting all the silicon (Si) in consideration of the chemical formula and the molecular weights of silicon (Si) and hydrogen fluoride (HF).

An operation S200 of removing the hydrogen fluoride (HF) residing after the chemical reaction is performed. The hydrogen fluoride (HF) is evaporated into gas by heating the hydrogen fluoride (HF) to a boiling point or higher. Although the boiling point of the hydrogen fluoride (HF) in the hydrogen fluoride solution may vary according to the concentration of the hydrogen fluoride (HF), it is a maximum of about 120° C. The hydrogen fluoride (HF) may be evaporated into gas and then is removed by heating the treatment liquid to a temperature or higher.

An operation S300 of adjusting a temperature and a concentration of the phosphoric acid solution, from which silicon (Si) and hydrogen fluoride (HF) are removed, to a temperature and a concentration suitable for using the phosphoric acid solution in the substrate treating process. Then, they may be adjusted to a temperature of 160° C. to 180° C. and a concentration of 90% to 92%.

According to an embodiment of the inventive concept, a process of etching a silicon nitride film on a substrate may be efficiently treated.

Further, according to an embodiment of the inventive concept, a phosphoric acid solution may be efficiently regenerated from a used solution.

The above-mentioned detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A method for treating a substrate, comprising:
    etching a silicon nitride film by supplying a treatment liquid comprising a first solution and a second solution onto the substrate;
    measuring concentration of silicon in the treatment liquid;
    determining whether the concentration of silicon in the treatment liquid exceeds a predetermined value; and
    adding hydrogen fluoride to remove silicon from the treatment liquid in a case when it is determined that the concentration of silicon exceeds the predetermined value,
    wherein the first solution comprises phosphoric acid, and the second solution comprises silicon, hydrogen fluoride, and phosphoric acid,
    wherein a temperature of the first solution is higher than a temperature of the second solution, and
    wherein the temperature of the first solution is 160° C. to 180° C., and the temperature of the second solution is 10° C. to 30° C.

2. The method of claim 1, wherein the first solution and the second solution are supplied to the substrate after being inline-mixed.

3. The method of claim 1, further comprising cooling down the treatment liquid after etching the silicon nitride film to a temperature lower than the temperature of the first solution.

4. The method of claim 3, further comprising measuring a concentration of hydrogen fluoride and phosphoric acid in the cooled treatment liquid.

5. The method of claim 3, wherein the temperature of the cooled treatment liquid is higher than the temperature of the second solution.

6. A method for treating a substrate, comprising:
    etching a silicon nitride film by supplying a treatment liquid comprising a first solution and a second solution onto the substrate;
    cooling down the treatment liquid after etching the silicon nitride film to a temperature lower than the temperature of the first solution;
    measuring concentration of silicon in the treatment liquid;
    determining whether the concentration of silicon in the treatment liquid exceeds a predetermined value; and
    adding hydrogen fluoride to remove silicon from the treatment liquid in a case when it is determined that the concentration of silicon exceeds the predetermined value,
    wherein the first solution comprises phosphoric acid, and the second solution comprises silicon, hydrogen fluoride, and phosphoric acid, and
    wherein a temperature of the first solution is higher than a temperature of the second solution.

7. The method of claim 6, wherein the first solution and the second solution are supplied to the substrate after being inline-mixed.

8. The method of claim 6, further comprising measuring a concentration of hydrogen fluoride and phosphoric acid in the cooled treatment liquid.

9. The method of claim 6, wherein the temperature of the cooled treatment liquid is higher than the temperature of the second solution.

* * * * *